(12) United States Patent
Pennaz et al.

(10) Patent No.: US 7,821,794 B2
(45) Date of Patent: Oct. 26, 2010

(54) LAYERED LABEL STRUCTURE WITH TIMER

(75) Inventors: Thomas J. Pennaz, Champlin, MN (US); David G. Sime, Minnetonka, MN (US)

(73) Assignee: Aveso, Inc., Fridley, MN (US)

( * ) Notice: Subject to any disclaimer, the term of this patent is extended or adjusted under 35 U.S.C. 154(b) by 1093 days.

(21) Appl. No.: 11/231,360

(22) Filed: Sep. 19, 2005

(65) Prior Publication Data

US 2006/0227669 A1      Oct. 12, 2006

Related U.S. Application Data

(63) Continuation-in-part of application No. 11/209,345, filed on Aug. 22, 2005, now Pat. No. 7,599,192.

(60) Provisional application No. 60/670,076, filed on Apr. 11, 2005.

(51) Int. Cl.
*H05K 1/18* (2006.01)
(52) U.S. Cl. ........................................ 361/761; 361/760
(58) Field of Classification Search ................ 361/761, 361/783; 235/488; 257/679
See application file for complete search history.

(56) References Cited

U.S. PATENT DOCUMENTS

| | | | |
|---|---|---|---|
| 4,684,795 A * | 8/1987 | Colgate, Jr. .................. | 235/457 |
| 4,701,601 A | 10/1987 | Francini et al. | |
| 4,841,128 A | 6/1989 | Grottrup et al. | |
| 4,993,810 A * | 2/1991 | Demiryont ................... | 359/265 |
| 5,412,199 A | 5/1995 | Finkelstein | |

(Continued)

FOREIGN PATENT DOCUMENTS

DE      19631557 A1      2/1998

(Continued)

OTHER PUBLICATIONS

International Search Report/Written Opinion for PCT Patent Application No. PCT/US2006/013225, mailed Jul. 17, 2008, pp. 8.

(Continued)

*Primary Examiner*—Jinhee J Lee
*Assistant Examiner*—Abiy Getachew
(74) *Attorney, Agent, or Firm*—Oliver A.M. Zitzmann

(57) ABSTRACT

The present invention relates to a thin, layered, variable label structure with built-in electronic functionality. The display and/or other functional elements in the structure may be formed by printing processes. The label structure includes a thin, layered structure with an active display, comprising a base layer and a cover layer of material and a display component situated between the base layer and the cover layer. The display is formed with a layer of electrochromic ink and a pair of spaced apart electrodes. The cover layer includes a window to allow for the layer of electrochromic ink to be visible through the cover layer. The label also is configured to respond to an actuating event by completing an electrical connection between a power source and the pair of spaced apart electrodes of the display component, thereby causing the display to change its appearance. The actuating event may include a variety of occurrences, such as: pressing a switch on the label, introducing a power source to activate the display, and a sensor sensing a condition near the label.

37 Claims, 9 Drawing Sheets

U.S. PATENT DOCUMENTS

| | | | |
|---|---|---|---|
| 5,434,409 A | 7/1995 | Tsubusaki | |
| 5,608,203 A | 3/1997 | Finkelstein | |
| 5,745,988 A | 5/1998 | Hohmann et al. | |
| 5,756,379 A | 5/1998 | Haghiri-Tehrani | |
| 5,763,869 A | 6/1998 | Moll et al. | |
| 5,800,763 A | 9/1998 | Hoppe et al. | |
| 5,834,755 A | 11/1998 | Haghiri-Tehrani et al. | |
| 5,851,854 A | 12/1998 | Haghiri-Tehrani et al. | |
| 5,856,661 A | 1/1999 | Finkelstein et al. | |
| 5,857,079 A | 1/1999 | Claus et al. | |
| 5,880,934 A | 3/1999 | Haghiri-Tehrani | |
| 5,888,624 A | 3/1999 | Haghiri et al. | |
| 5,928,788 A | 7/1999 | Riedl | |
| 5,935,693 A | 8/1999 | Schwenk et al. | |
| 5,951,810 A | 9/1999 | Tarantino | |
| 5,962,840 A | 10/1999 | Haghiri-Tehrani et al. | |
| 6,013,945 A | 1/2000 | Haghiri-Tehrani | |
| 6,036,232 A | 3/2000 | Kaule et al. | |
| 6,036,233 A | 3/2000 | Braun et al. | |
| 6,147,320 A | 11/2000 | Bernecker et al. | |
| 6,176,430 B1 | 1/2001 | Finkelstein et al. | |
| 6,176,431 B1 | 1/2001 | Hoppe et al. | |
| 6,283,378 B1 | 9/2001 | Welling | |
| 6,283,509 B1 | 9/2001 | Braun et al. | |
| 6,347,040 B1 | 2/2002 | Fries et al. | |
| 6,379,779 B1 | 4/2002 | Murl | |
| 6,519,497 B1 | 2/2003 | Blome et al. | |
| 6,543,163 B1 * | 4/2003 | Ginsberg | 40/219 |
| 6,575,371 B1 | 6/2003 | Hoppe et al. | |
| 6,639,709 B2 | 10/2003 | Vincent et al. | |
| 6,655,598 B1 * | 12/2003 | Curiel | 235/487 |
| 6,659,355 B1 | 12/2003 | Fischer et al. | |
| 6,712,397 B1 | 3/2004 | Mayer et al. | |
| D490,104 S | 5/2004 | Lubking | |
| 6,744,549 B2 | 6/2004 | Vincent et al. | |
| 6,745,944 B2 | 6/2004 | Dell | |
| 6,749,925 B2 | 6/2004 | Hoppe et al. | |
| 6,769,618 B1 | 8/2004 | Finkelstein | |
| 6,793,143 B2 | 9/2004 | Frey et al. | |
| 6,817,532 B2 | 11/2004 | Finkelstein | |
| 6,879,424 B2 | 4/2005 | Vincent et al. | |
| 6,902,116 B2 | 6/2005 | Finkelstein | |
| 2002/0167500 A1 | 11/2002 | Gelbman | |
| 2002/0171081 A1 | 11/2002 | Vincent et al. | |
| 2003/0062830 A1 | 4/2003 | Guenther et al. | |
| 2003/0201331 A1 | 10/2003 | Finkelstein | |
| 2003/0222334 A1 | 12/2003 | Ikeda et al. | |
| 2003/0226899 A1 | 12/2003 | Finkelstein | |
| 2004/0026495 A1 | 2/2004 | Finkelstein | |
| 2004/0026506 A1 | 2/2004 | Finkelstein | |
| 2004/0056296 A1 * | 3/2004 | Arao et al. | 257/303 |
| 2004/0160540 A1 * | 8/2004 | Hirakata et al. | 349/38 |

FOREIGN PATENT DOCUMENTS

| | | |
|---|---|---|
| DE | 19923138 C1 | 11/2000 |
| DE | 19939347 C1 | 2/2001 |
| DE | 10219306 A1 | 11/2003 |
| EP | 10219306 A1 | 11/2003 |
| WO | 199849652 | 5/1998 |
| WO | 2002101674 | 12/2002 |

OTHER PUBLICATIONS

International Search Report/Written Opinion for PCT Patent Application No. PCT/US2006/036176, mailed Jul. 17, 2008, pp. 7.

International Search Report/Written Opinion for PCT Patent Application No. PCT/US2006/013236, mailed Jul. 21, 2008, pp. 9.

* cited by examiner

LAYERED LABEL STRUCTURE WITH TIMER

CROSS REFERENCE TO RELATED APPLICATIONS

This application claims the benefit of U.S. Provisional Application No. 60/670,076, filed Apr. 11, 2005 and U.S. patent application Ser. No. 11/209,345, filed Aug. 22, 2005.

FIELD OF THE INVENTION

The present invention relates to a thin, layered, active label structure with built-in electronic functionality, for example an embedded active display and associated electronics for driving the display. The display and/or other functional elements in the structure are formed by printing processes.

BACKGROUND OF THE INVENTION

Product labels have played an important role in communicating information to people and devices. Typically, the primary purpose of labels is to provide information such as: directions for use; product identification; trademarks; promotions; production; freshness or "use-by" dates; product authentication; and other product-related information. Existing labels generally convey static information such as type, logos, graphics and product identification information, such as barcodes and the like. Although variable information (e.g., product serial numbers) has been introduced to individual parts of some existing labels, once such labels are produced, the image cannot be changed without removing layers or physically altering the surface.

Though it is highly desirable to include an active image in product labels, few effective and affordable methods currently achieve this function. Currently, labels are generally produced in extremely large volumes at very low cost using traditional printing processes. Thus, the desire to include active image functionality to the labels through existing methods has also been limited by the inability to introduce an active image without modifying the existing manufacturing processes and absorbing the associated costs. The desire to provide active image functionality through existing methods is also present for applications that are not labels in the usual sense (i.e. labels are usually affixed to the product or its container) but are closely associated with a product or service; for example, a timer token packaged with a product indicating elapsed time relating to product use, variable use instructions, or other active package inserts may be produced to accompany product packaging or be constructed directly on product packaging.

Some methods exist in the art to provide active image labels through the use of thermochromic or photochromic inks that respond to environmental conditions such as temperature or light. However, the utility of such approaches is limited due to the extreme environmental changes required to alter the image. Likewise, optically variable images have been used to add active components to labels, but the utility of such approaches is limited by the inability to control the activation of an alternate image.

Other active labels implement methods to communicate information from the label to a machine through the use of RF energy for providing information. Although this method provides additional information to compatible machines, it does not allow additional communication to humans, because the stored information is not communicated visually.

Another approach for providing active images in labels has been through thin displays. Displays are generally differentiated from print by the capability to actively change an image. Print is considered static, because once the image is produced, it cannot change or be influenced by the external environment. Displays, on the other hand, have the ability to change, based on a given input or environmental condition.

Another differentiating factor between displays and traditional printed labels is cost. The cost for traditional print is very low due to the large volumes produced; the substrate used (paper) and the production processes. Typical printing processes run at very high speeds and use low cost substrates to convey information at the extremely low cost point necessary for widespread application. Print processes can easily change over from one print job to the next. Trillions of square feet of static print are produced annually via these processes on a global basis. They include newspapers, product packaging, product labels, publications and many other applications.

By contrast, conventional displays are typically produced by traditional electronic assembly processes. Liquid Crystal Displays (LCDs) and Organic Light Emitting Diodes (OLEDs) are produced in conventional electronic fabrication plants, using micro-assembly techniques, and are built on polarized glass. Extreme precision is required on the disposition of the active components, and environmental conditions also must be tightly controlled.

Displays can vary in complexity from simple, single dot or icon images to full-color video. The information content depends on the purpose of the specific display and the particular communication need. Examples may include a single icon that communicates a desired warning message, an alphanumeric display that communicates words and numeric values or a matrix addressable display that communicates more complex images such as maps or pictures. The rate at which the display can change or update determines the stream of information which can be updated.

Display technology has evolved to meet society's need for increased information. Of particular interest is the need to provide displays that are thin and withstand flexing at a cost that allows widespread implementation on disposable items in extremely high volumes.

Several attempts have been made to produce such displays. LCDs were developed using glass as the substrate. Some recent flexible LCD developments achieve the necessary flexibility but are still extremely costly to produce. Other flexible technologies include electrophoretic displays such as those described in U.S. Pat. No. 6,445,489. Electrophoretic displays exhibit the necessary flexibility but currently cannot be produced with existing high-volume and low-cost printing production processes.

Other advances have been made in higher content displays as well. OLEDs provide color and very high resolution. OLEDs can be made flexible but require significant power and are most suitable for high value, high content applications.

As described, printing techniques generally benefit from cost savings and production efficiencies. Electro-phoretic displays take advantage of some of the print manufacturing process benefits. This technology may implement screen printing to deposit the active layer between a conductive front and backplane. However, relatively thick layers of ink are required and cell thickness must be tightly controlled. Moreover, operating voltages for electro-phoretic displays are high, typically more than 7 volts, which requires additional components to alter the power from traditional batteries.

Thus, there is a need for a thin and flexible, layered label structure with built-in electronic functionality, such as an embedded active display and associated electronics for driving the display. This need also extends to non-label structures as well, such as timer tokens, variable instructions, electrochromic holographic structures, or other active structures. There is also a need for such label and non-label structures with active displays that visually convey desired information to humans. Moreover, there is a need to produce a structure with electronic functionality through low-cost methods, such as printing processes, that allow for widespread implementation on disposable items in extremely high volumes. There is also a need for the structure with electronic functionality to be powered by a relatively low voltage and/or current.

BRIEF SUMMARY OF THE INVENTION

The present invention relates to a thin, layered, variable label structure with built-in electronic functionality. The display and/or other functional elements in the structure may be formed by printing processes. The label structure includes a thin, layered structure with an active display, comprising a base layer and a cover layer of material and a display component situated between the base layer and the cover layer. The display is formed with a layer of electrochromic ink and a pair of spaced apart electrodes. The cover layer includes a window to allow for the layer of electrochromic ink to be visible through the cover layer. The label also is configured to respond to an actuating event by completing an electrical connection between a power source and the pair of spaced apart electrodes of the display component, thereby causing the display to change its appearance. The actuating event may include a variety of occurrences, such as: pressing a switch on the label, introducing a power source to activate the display, and a sensor sensing a condition near the label.

DETAILED DESCRIPTION OF THE INVENTION

Introduction

The present invention relates to label display technology that can be produced entirely or primarily through printing processes, such as the flexographic, gravure, or rotary screen processes. The resulting display labels are extremely thin and flexible and can be printed on a variety of substrates such as papers, films, foils or other flexible substrates. The low cost associated with the printing processes and the label materials allows implementation at very high volumes that cannot be achieved with current display technologies. The display labels may be powered through a variety of means, such as an external probe, an RF antenna, or an internal embedded or printed battery. The label structures described herein may also be constructed in non-label embodiments as well, such as timer tokens, package instructions, electrochromic holographic structures, or other active structures.

The display labels provide active images that can be controlled by a variety of actuating events that cause the label to display visual information. The display labels of the present invention typically employ electrochromic material as the display, which responds chemically and visibly to an actuating event. The display may be produced with existing print processes used to manufacture conventional static images by depositing the electrochromic material in the desired configuration, as described in more detail below. Activation of the label's image requires an electrical input, which can be controlled through the use of printed switches, sensors, or other low cost actuation methods.

The invention allows for the combination of active images in the electrochromic display material with static images elsewhere in the label, which increases the quantity of information communicated visually by the label. The information communicated by the display label may be simple, such as an "on/off" message indicator or "good/bad" message indicator. Alternatively, more complicated information may also be communicated through the display label through the use of configurations such as an active matrix display. Regardless of the complexity of the information communicated, the image of the active display generally changes in response to an actuating event.

Display

Figure 1:
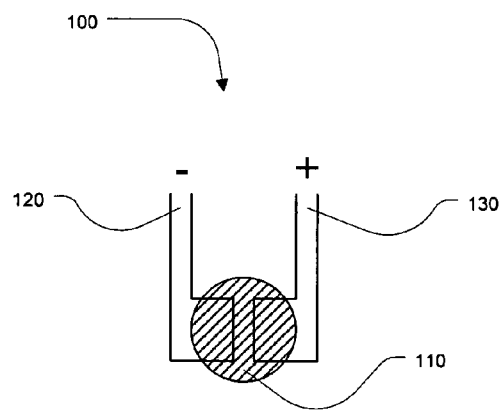
FIG. 1 is a plan view of a display electrode configuration with a side-by-side contact arrangement.

With reference to FIG. 1, the display label includes an electrochromic display material 110 deposited in the label structure in contact with a pair of spaced apart electrodes 120 and 130, which may be described as the anode and cathode of the display. The display construction, described in more detail below, requires the positive electrode (cathode) 130 and negative electrode (anode) 120 be configured to supply a direct current and potential across the display material 110. The electrochromic display material 110 is typically formed with non-aqueous electro-active ink. Examples of such inks are disclosed in U.S. Pat. Nos. 6,639,709, 6,744,549, and 6,879,424, and U.S. application Ser. No. 11/029,201, entitled "Universal Display Module," filed Jan. 4, 2005, each hereby incorporated by reference.

A variety of actuating events, as described below, may trigger a change in the display material 110. An actuating event creates a potential difference across the two electrodes 120 and 130, which in turn causes at least a portion of the display material 110 to image, i.e., to present a visible change in the display material 110. Specifically, the display material 110 is caused to image by connecting the electrodes to a DC power supply. The applied voltage causes current to run across the display material 110, which, in turn results in illumination or "imaging" of the display material ink. The non-aqueous ink described above is known to image at about 1.2 volts DC, but lower voltages such as 0.8 volts may suffice in certain configurations.

The geometry of the electrodes and display material can be varied independent of the power source provided, as is described in more detail below. The electrodes are configured in either a planar configuration, formed side-by-side on the same substrate of the display label, or in a co-planar geometry, formed on different substrates of the display label. In the co-planar arrangement, the anode and cathode are spatially and electrically separated by spacer or a suitable dielectric material.

Label Construction

The display label components of the present invention are produced through traditional print processes such as the rotary or flat screen printing, flexography, or gravure processes. The construction of the label structure, including the display material and power source, may be produced through a high speed print process, which allows for high-quantity and low-cost production of the labels. Additionally, non-printed, preformed components, such as integrated circuits and sensors, may be inserted to the label structure during or after the printing process.

Suitable print processes include offset lithography, flexography, gravure, screen printing and digital printing such as electrostatic toners and ink jet. Offset lithography dominates the traditional print markets due to the high speeds, full color and substrate tolerances achieved. The next highest volume print methods include flexography and gravure. The primary advantages of these processes are that a wide variety of inks and substrates can be used at high speed. Screen printing can be used in either a rotary format or flat-bed format. The primary advantage of screen printing is that thicker ink layers can be deposited than by either lithography, flexography or gravure, but the process typically runs much slower. These methods do not typically allow for changes on a sheet-by-sheet basis. However, when variability of the image is not a dominating consideration or the print run is long, these methods entail much lower cost than other print methods.

The primary advantage of digital print methods is the ability to change images on a sheet-by-sheet or cell-by-cell basis which allows variable print and is particularly economical when only short print runs are required. This method may be desirable when variable images are required, such as serialization of a set of labels.

FIGS. 2A, 2B, 2C, and 2D show a schematic cross-section side view of a label structure 200 incorporating an active display 110, each powered by different means in accordance with embodiments of the present invention. The label structure 200 includes several discrete layers, which are applied sequentially during the printing process. In the embodiments shown in FIGS. 2A-2D, these layers, or components, include a base layer 210, circuitry 220, display material 110, a laminating adhesive 230, a cover film 240, and a graphic ink layer 250.

The base layer, or base substrate, 210 supports the overall label structure. Base layer 210 is typically a traditional label stock and may include a poly-coated paper or film with a pressure sensitive adhesive coated on one side and may be laminated to a silicone coated release sheet. However, different substrates may be suitable for the base layer 210, such as paper, card stocks, un-supported films and the like.

The circuitry 220 includes anodic electrode 120 and cathodic electrode 130, along with their respective conductive traces 290 and 280 connecting them to a power source and any other desired interconnecting circuits and pixels. The electrodes 120 and 130 and conductive traces 290 and 280 may be produced using a variety of conductive materials for both the anode and cathode. For planar electrode configurations, examples of suitable electrode conductor materials for the circuitry layer 220 include printed conductive silver, etched or stamped foils, printed conductive carbon or die cut metallic foils. The cathode conductor 130 should have chemical resistance to the electro-active ink, suitable conductivity, and the ability to pattern the electrodes spatially. Typically, the traces 280 and 290 are produced by a printing process with the same conductive material. For co-planar electrode configurations, suitable backplanes in circuitry layer 220 on base layer 210 can be constructed using a wide variety of conductive materials. The backplane typically forms the display image, which can be as complex as a matrix addressable pattern or as simple as a single pixel indicator.

The laminating adhesive 230 encloses the display material 110, and the cover film 240 encapsulates the top portion of the display material 110. The adhesive 230 is applied by printing around the display material 110 and adheres the cover film 240 to the base layer 210 or the circuitry layer 220. The cover film 240 is a clear film of any number of suitable materials, such as polyester, polyethylene, or PVC, and it is laminated over the display material 110 and adhesive 230. In a side-by-side, or planar, configuration as shown in FIGS. 2A-2D, where the positive electrode 130 and negative electrode 120 are both situated in the same layer, namely the circuitry layer 220, the display material 110 is encased by cover film 240, which is a clear overprint to protect the lower layers and contain the display materials. The anodic and cathodic electrodes 120 and 130 are produced as part of circuitry layer 220 on top of layer 210. When power is applied to the traces 280 and 290, the current flows between the two electrodes 120/130 and activates the display.

Alternatively, cover film 240 may be a clear conductive film, such as Indium Tin Oxide coated polyester (ITO film). In this case, the cathode is printed and the ITO both forms the anode and functions as the protective layer. The ITO film is attached to the backplane through the use of a printed laminating adhesive. A conductive adhesive can also be printed to provide an electrical connection between the ITO and the backplane, if desired. Connection of the frontplane conductor 240 to the backplane, if desired, may also be achieved by depositing a drop of conductive adhesive which provides an electrical connection between the anode and the anode circuit on the backplane. When voltage is applied to the display, current flows between the backplane conductor and the surface of the ITO film.

If a cover film 240 is not desired, a protective layer, such as varnish, can be printed over the display 110 to protect and contain it. The varnish is deposited as a printed coating and is cured through UV or EB radiation or through thermal drying during the print process.

A graphic ink layer 250 may be applied to the cover film 240. The graphic ink layer 250 is printed with traditional graphic inks to produce the desired static image, message, or other information for the label, such as calibration marks having a specified relation to the display or directions for use. The graphic ink layer 250 includes a window to allow the display material 100 to be visible, which allows the static images of the graphic ink layer 250 to be used in concert with the active images produced by in the display material 110. For example, it may be desirable for certain applications to print a reference color or color scale on the graphic ink layer 250 that approximates the active color of the display material 110 in proximity of the active image to provide a visual reference for the user.

Figure 2A:
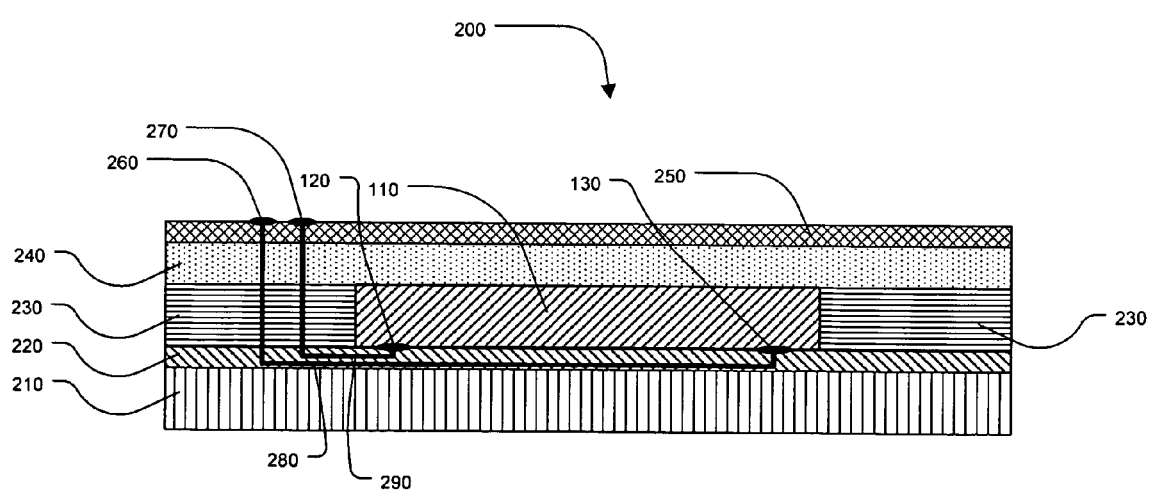
FIG. 2A is a schematic cross-section side view of a label structure of the present invention incorporating an active display and terminals for contacting an external power probe for powering the display.

In some embodiments, the label structure 200 includes an IC, sensor, or other electrical component that is not printable and which is in electrical connection with the electrodes 120/130 and configured to drive display material 110. The IC provides dynamic communication to the display 110 to achieve varying images as desired. The incorporation of an IC, sensor, or other electrical component provides a means to increase the complexity of display possibilities, thereby achieving greater information communication. For example, FIG. 2D shows a label structure 200 including a sensor 330 embedded into circuitry layer 220 by adhesive 230. The sensor 330 may be any number of known sensors, such as an environmental sensor that measures temperature or pressure. The sensor may be placed so as to sense conditions actually present in or near a product or to sense more generally the conditions surrounding a product.

In addition to the particular layers and components described, for particular applications of the label structure 200, a variety of other layers and electrical components may be incorporated into circuitry 220 or even other layers of the structure 200. The surfaces of the structure 200 and the various constituent layers can be used to carry the necessary connecting circuitry for electrical elements. Each layer's front and back may be used for circuitry, including printable resistive, dielectric, or other components. Techniques such as through-hole printing may be employed to bring a conductive circuit from one face of a layer to the other. This is accomplished by providing a via through a film layer that is connected electrically by providing a conductive material through the via. The circuitry may be in the form of conductive traces such as printed silver or other conductive, resistive, or dielectric materials that are known in the art. For example, in one embodiment of the present invention the label structure is usable as a timer device. In this embodiment, printed resistors may be provided to govern the current flow to individual pixels of the display material 110, which alters the rate of imaging of each pixel. As described in more detail below, by appropriately calibrating the resistors as a function of time, the individual pixels are thereby sequentially activated, which allows the label to function as a low cost timer.

Thus, all of the elements and components of the label structure 200 may either be printed in a printing line or readily added to the steps occurring in a printing line. Known processes may be used to print, or build with printed layers, a wide variety of elements such as display pixels, conductive traces, resistors, switches, batteries, capacitors, conductive adhesive, electrodes, capacitors, and antennas. These processes are described in more detail in U.S. patent application Ser. No. 11/209,345, entitled, "Layered Structure with Printed Elements," filed Aug. 22, 2005, which is herein incorporated by reference.

Power

In addition to the need to produce the label structure in high volumes, a low cost means to stimulate and control the display must be implemented. Electrical power is required to activate most display technologies, and minimizing the power required to activate the display reduces the overall cost of the display label. The electrochromic display technology described in U.S. Pat. Nos. 6,639,709, 6,744,549, and 6,879,424 operates at low voltage and current (on the order of 0.8 to 3.0 volts). For instance, in some embodiments the minimum voltage required to activate the image may be less than 1V. The electrical current required for this technology is a function of the display thickness. For example, display thicknesses may be printed at 0.011, 0.005, and 0.003 inches. The corresponding response time for each display (i.e., the time from application of power to a visible change) under identical power conditions is 250 milliseconds, 80 milliseconds, and 50 milliseconds respectively.

Generally, the actuating event that activates the display material does so by completing a circuit between a power source and the electrodes 120/130. The displays may be activated by a variety of power sources, such as external probes, RF fields, and internal power. The selection of power source may be dictated by the particular application of the display label.

In one embodiment of the present invention, an external power supply such as a probe is employed to activate the display. With reference to FIG. 2A, the label structure 200 includes a positive terminal 260 and a negative terminal 270 that are electrically connected to electrodes 130 and 120 respectively. The terminals are connected to the electrodes by conductive traces 280 and 290. Because structure 200 includes a plurality of layers, each layer, front and back, may be used for circuitry, including printable conductive traces. Techniques such as through-hole printing may be employed to bring a conductive traces 280 and 290 from one face of a layer to the other as shown in FIG. 2A. The conductive traces may be a printed silver or other conductive material that is known in the art. This process is described in more detail in U.S. patent application Ser. No. 11/209,345. Because terminals 260 and 270 are situated on an outer surface of the label structure, they are exposed such that they may be contacted by an external probe to supply the desired voltage and current to the display, which changes the image of the display material 110. The external supply may be part of a larger assembly, if desired. Typically, such an external supply is battery operated and portable. With the external probe, the actuating event is typically the action of bringing the probe into contact with terminals 260 and 270. Such a label provides an inexpensive way to display an otherwise invisible authentication marking.

Figure 2B:
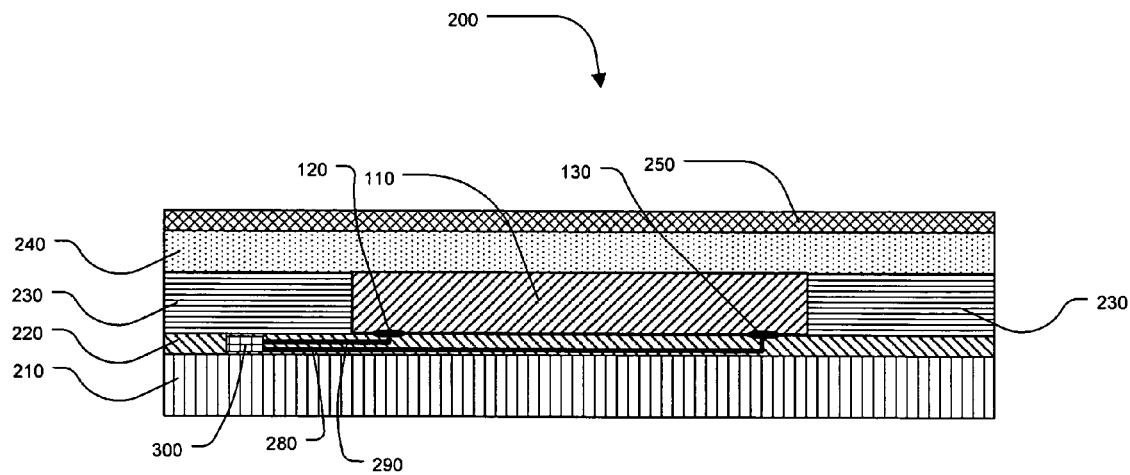
FIG. 2B is a schematic cross-section side view of a label structure of the present invention incorporating an active display and an RF antenna for powering the display.

As shown in FIG. 2B, in another embodiment of the present invention the label structure 200 includes a properly tuned RF antenna 310. The antenna 310 is electrically connected directly to the electrodes 120 and 130 by traces 290 and 280 and may be printed through the processes described below using conductive material such as that used to construct the display backplane. With an RF power source, the actuating event is typically the action of bringing an RF transmitter (not shown) into sufficient proximity to RF antenna 310. A current is generated through the display when the antenna is inductively coupled to the transmitter with sufficient power. Because this power source provides an alternating current, a diode must be included in the display circuit to convert the current to direct current, which is required to activate the displays of the present invention. The diode can be provided through a traditional surface mount component or can be printed along with the other electrical components of the label. If the diode circuit is pre-produced on the desired label substrate in a pre-determined location, it may subsequently be finished through the printing process to add the other display components. Such a label provides an inexpensive way to display an otherwise invisible authentication marking.

Figure 2C:
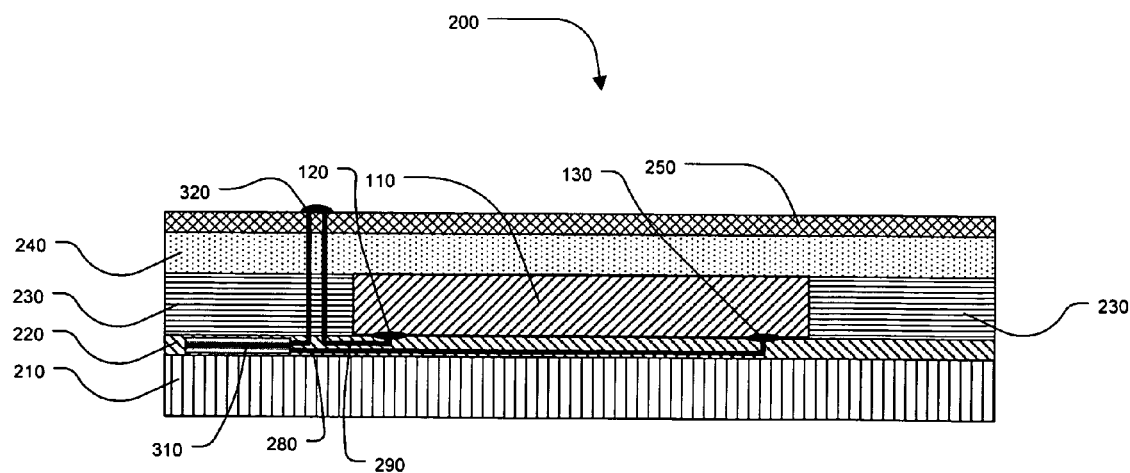
FIG. 2C is a schematic cross-section side view of a label structure of the present invention incorporating an active display and an internal battery for powering the display.
Figure 2D:
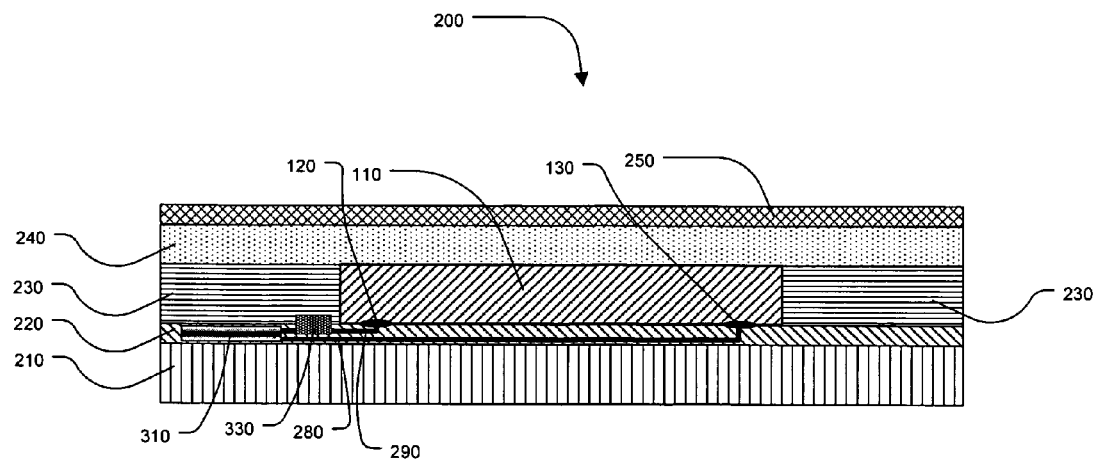
FIG. 2D is a schematic cross-section side view of a label structure of the present invention incorporating an active display, an internal battery for powering the display, and a sensor for actuating the display.

As shown in FIGS. 2C and 2D, in yet another embodiment of the invention the display is powered by an internal battery 310, so that an external power source is not required. As with the RF antenna 300, the battery 300 is electrically connected to electrodes 120 and 130. The internal battery 310 may be a pre-made component that is encapsulated or entirely printed into the label structure as an integrated part of the label. Specifically, during the label construction, the anode and cathode of the battery are printed along with the desired display image. This process is described in more detail in U.S. patent application Ser. No. 11/209,345. The display is actuated by external stimuli, such as touch, or by internal stimuli, such as sensor 330. For example, a traditional membrane switch 320 or other means to turn the display on and off is provided and may be printed through known printing processes, as shown in FIG. 2C. The switch 320 can be made permanent by providing a small conductive adhesive pad that permanently closes the switch when activated. Alternatively, an internal stimuli may actuate the display, such as sensor 330 that may be pre-made and incorporated into circuitry layer 220 during the printing process. The sensor 330 may be as simple as a component that closes a switch in response to an environmental condition being satisfied. For example, the sensor 330 may be an environmental sensor that measures temperature. Here, the actuating event is the structure reaching a predetermined high or low temperature, in response to which the sensor completes the electrical connection between electrodes 120/130 and the power source, battery 310. As a further alternative, the sensor 330 can be one that accumulates or integrates over time other variables to which it is sensitive. Then, the sensor may deliver an activation output from the battery 310 only after a period of time; such a circuit may sense a longer term temperature exposure rather than a single threshold event.

The label structure of the present invention has numerous applications, each of which provides for activating the display material in response to an actuating event. In one example, a label structure is externally powered with a probe and the display material includes only a single pixel with planar electrodes and a graphic over-lay 250. In another example, a display includes a single pixel with planar electrodes and graphic overlay and the display material is RF-activated. In yet another example, a display label includes a multi-pixel display with co-planar electrodes, and the display material is battery-powered and actuated by closing a membrane switch. In still yet another example, a display label includes RFID and a display and is actuated by an RF transmitter.

Timer

The present invention may be configured to provide a label structure with an active display that indicates a time interval. Because the color change in the display material 110 is a function of several controllable variables, such as voltage, current, and display material volume, a desired configuration of power supply, circuitry, and display material may provide a label structure that communicates elapsed time.

Figure 3A:
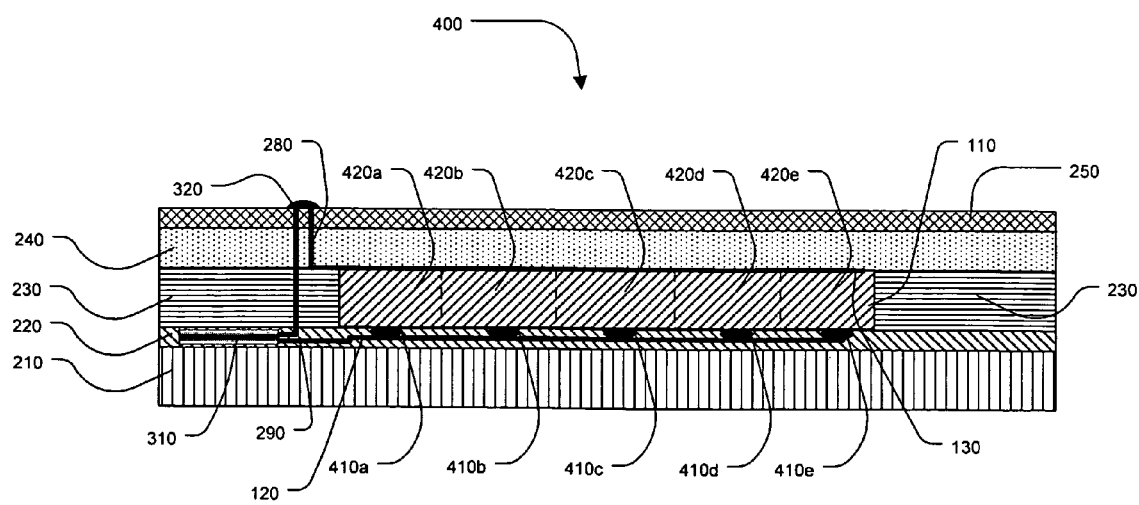
FIG. 3A is a schematic cross-section side view of a label structure of the present invention including a switch and internal battery and being configured to show elapsed time.

With reference to FIG. 3A, a label structure 400 may be assembled to communicate elapsed time by forming anodic electrode 120 to include a series of printed resistors 410a-410e in circuitry layer 220. Cathodic electrode 130 is formed at the intersection of display material 110 and cover film 240. This arrangement provides for five planar pixels or pixel areas 420a-420e within the display material 110.

In the configuration shown in FIG. 3A, the power source is printed battery 310, such as a carbon zinc battery with a battery cathode connected to the common electrode 130 and the battery anode connected to the anode 120, which includes separated printed resistors 410a-420e that connect to pixels 420a-420e respectively. Each of resistors 410a-410e has a distinct resistance. Although a battery provides the power source in this example, other power sources described herein and known in the art may also be suitable for timer constructions in accordance with the present invention.

In operation, responsive to an actuation event such as closing switch 320, the individual pixels 420a-420e are powered in parallel by the same power source 310. The current thereby supplied to each pixel 420 is greater for resistors 410 with lower resistance and lower for resistors 410 with greater resistance. Accordingly, because the development of color in each pixel 420 is a function of the current supplied that pixel, the resistance value of each resistor 420 may be specifically selected to correspond to the desired color development rate of the associated pixel. A static graphic in graphics layer 250 may be printed proximate each pixel 420 to indicate the corresponding elapsed time.

Figure 4A:
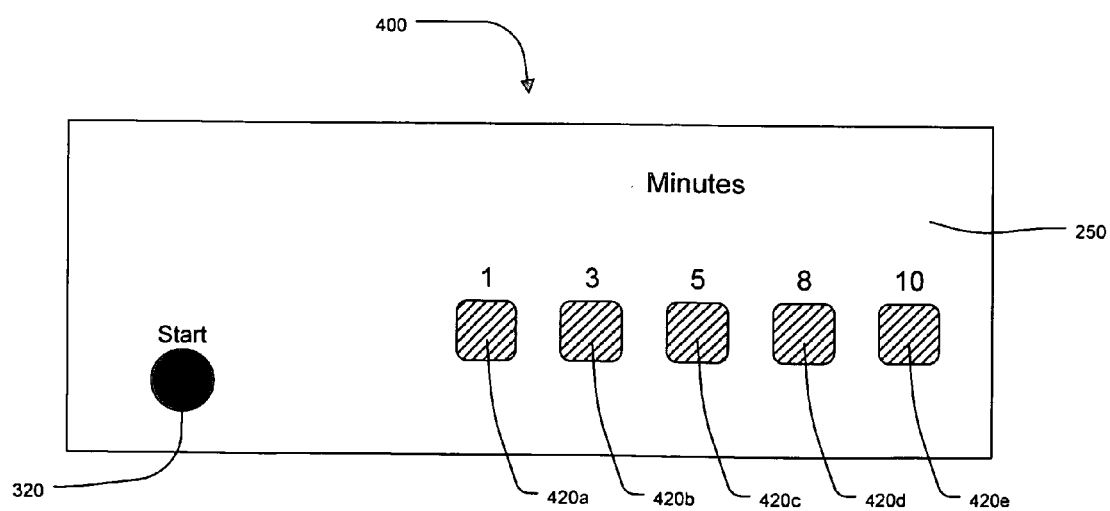
FIG. 4A is a top view of the label structure shown in FIG. 3A.

As shown in FIGS. 3A and 4A, in one example of this embodiment, backplane circuitry 220 is printed with five separate resistors 410. The resistors 410 are produced using a carbon resist ink well known in the art. The spacing between the five anodes within anode 120 and the common cathode 130 is 1 mm and the power supply is a printed carbon zinc battery 310 providing a potential difference of 1.5 volts. Resistor 410a has zero resistance, printed resistor 410b has a resistance of 140 Kohms, printed resistor 410c has a resistance of 350 Kohms, resistor 410d has a resistance of 600 Kohms, and resistor 410e has a resistance of 800 Kohms. Once actuated through switch 320, pixel 420a is activated in approximately one minute, which occurs when the color change of the display material 110 at pixel 420a becomes visible. Pixel 420b is activated in approximately three minutes, pixel 420c is activated in approximately five minutes, pixel 420d is activated in approximately eight minutes, and pixel 420e is activated in approximately ten minutes.

Figure 4B:
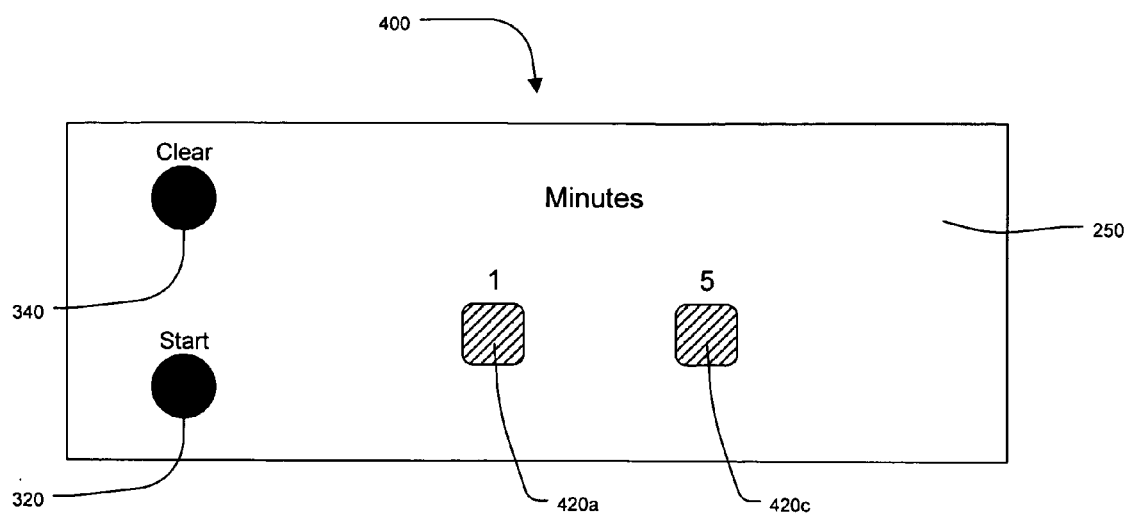
FIG. 4B is a top view of a label structure of the present invention including two switches and being configured to show elapsed time.
Figure 4C:
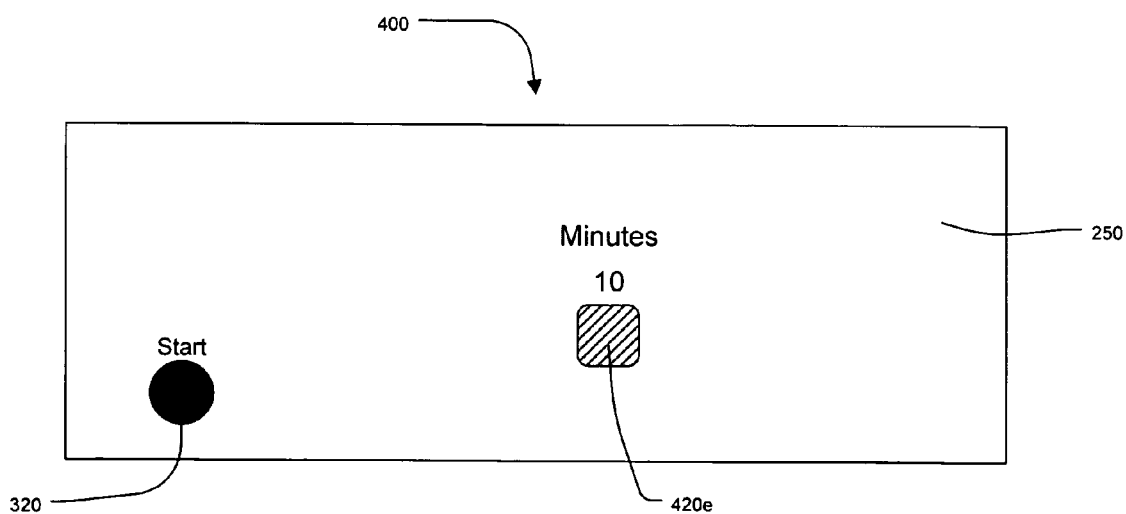
FIG. 4C is a top view of a label structure of the present invention including a sensor and being configured to show elapsed time.

Graphic ink layer 250 may include additional static information that provides context for the display 110, such as a time scale, time indicia, or other temporal visual image. For example, as shown in FIG. 4A, which is a top view of the structure shown in FIG. 3A, the graphic ink layer 250 includes the word "Minutes" and numbers corresponding to each pixel's 420 associated time. Graphic ink layer 250 also includes the word "Start" proximate switch 320, which actuates the timer. Numerous variations of this timer label are possible. For instance, with reference to FIG. 4B, a one minute and five minute, two pixel label structure can be constructed using two of the previous resistors, resistor 410a and 410c. FIG. 4B also includes a second switch 340, which is configured to clear the existing display pixels 420a and 420c to allow for a subsequent timer actuation with switch 320. With reference to FIG. 4C, a single pixel, ten minute indicator may be constructed by printing only resistor 410e from the label structure described above. Alternatively the display material 110 volume, instead of or in combination with a resistor, may be used to achieve coloration of the pixel at the desired time.

Figure 5A:
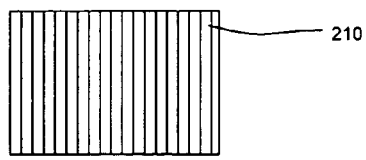
FIGS. 5A-5J are top views of a label structure of the present invention at various stations of a print process.
Figure 5F:
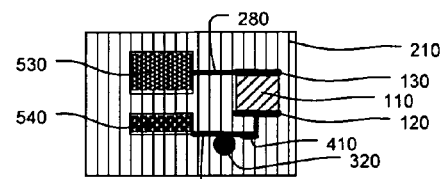
Figure 5B:
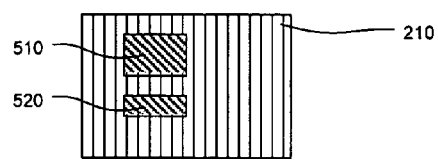
Figure 5G:
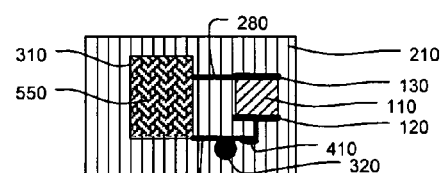
Figure 5C:
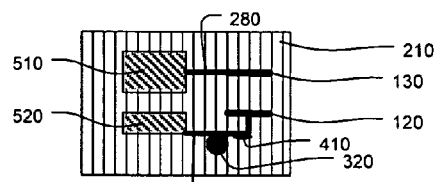
Figure 5H:
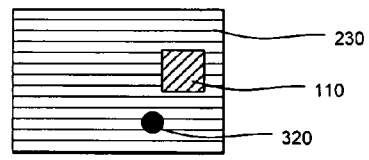
Figure 5D:
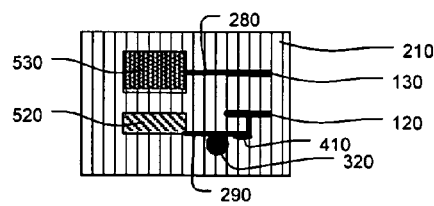
Figure 5I:
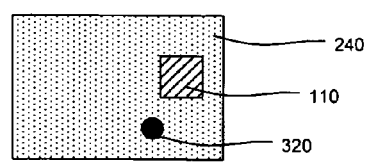
Figure 5E:
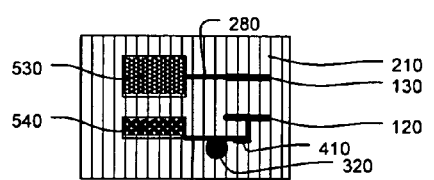

All or most of the components of the label structure 400 may be produced using the flexographic printing process, and one example print run is shown in FIGS. 5A-5J. In this example, the base substrate 210, shown in FIG. 5A, is a pressure sensitive coated 2 mil polyester film laminated to a silicone release liner. As shown in FIG. 5B, the first print station prints cathode and anode current collectors 510 and 520 for the battery power source 310, as part of circuitry layer 220, onto base substrate 210. As shown in FIG. 5C, the second print station applies the conductive silver circuit that forms the anode and cathode circuits 120/130, conductive traces 280/290, and the switch 320 layers to the base layer 210 as part of circuitry layer 220. An optional resistor 410 may also be printed along trace 290, as shown in FIG. 5C. As shown in FIG. 5D, the third print station prints a manganese dioxide cathode 530 over the cathode current collector 510. As shown in FIG. 5E, the next print station applies a metallic zinc ink 540 over anode current collector 520. As shown in FIG. 5F, the following print station applies the electro-active display material 110 to form at least one pixel area 420. As shown in FIG. 5G, the next station applies the battery electrolyte 550 over both the cathode 530 and the anode 540 to complete the battery power source 310. As shown in FIG. 5H, the next station prints a UV curable laminating adhesive 230, which provides a surround that encloses both the electro-active display area 110 and the battery area 310, and which may also cover the battery 310. As shown in FIG. 5I, the next station laminates the cover film 240 over the display material 110 and adhesive 230 to encapsulate the display. Cover film 240 includes a window of transparent material such that display 110 is visible therethrough.

Figure 5J:
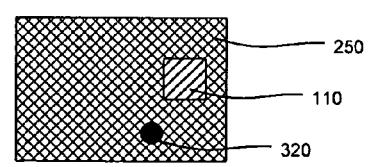

As shown in FIG. 5J, the next station applies graphics layer 250, which may be pre-printed with both the label graphics as well as a shorting pad for switch 320. The pre-printed web of graphics layer 250 is laminated to the cover film 240 using common laminating techniques well known in the art. Upon lamination, the laminating adhesive is cured with UV energy to seal the entire structure. Those skilled in the art will recognize the desired web path to achieve the above label construction.

The web produced above can be finished into the final desired construction using label finishing techniques such as die cutting with matrix stripping to achieve singulated labels. The product can be serialized by the use of ink jet, laser printing or thermal transfer of serial numbers to each individual label.

Figure 3B:
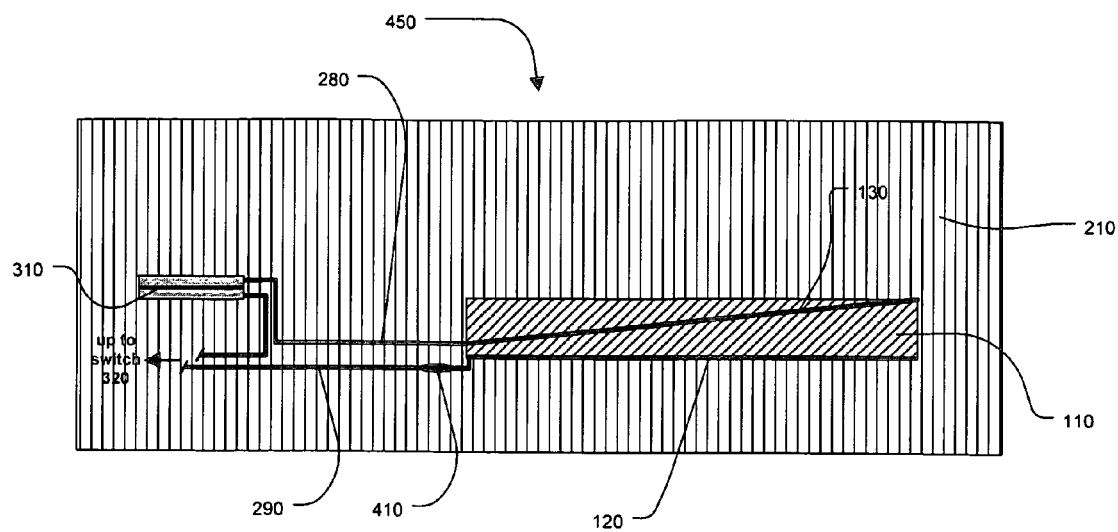
FIG. 3B is a schematic cross-section top view of another label structure of the present invention including a switch and internal battery and being configured to show elapsed time.
Figure 4D:
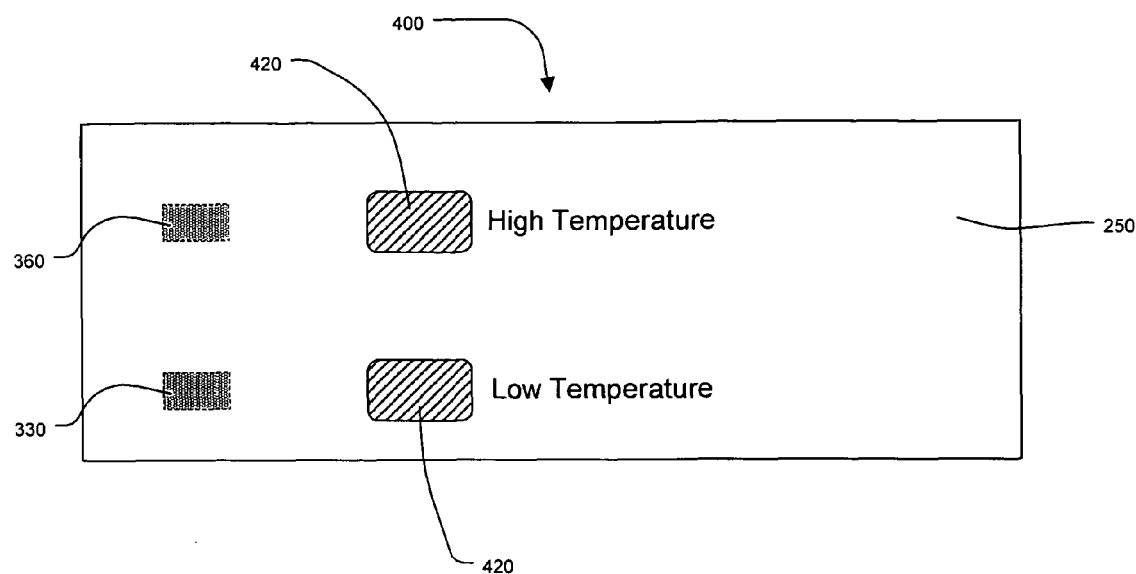
FIG. 4D is a top view of a label structure of the present invention including two sensors and two pixels.
Figure 4E:
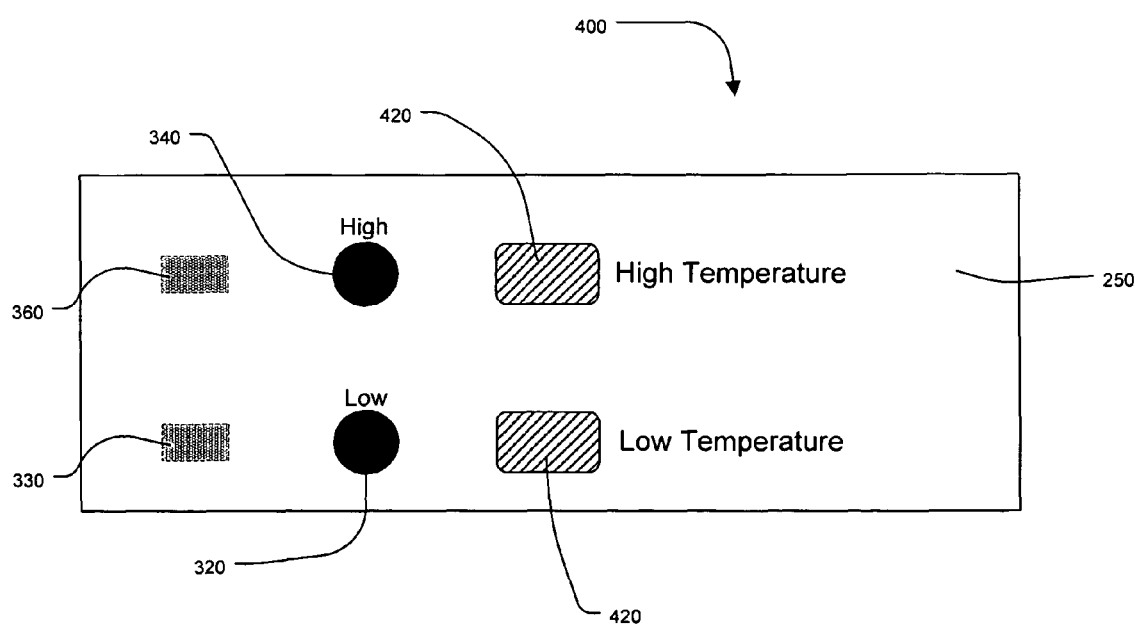
FIG. 4E is a top view of a label structure of the present invention including two sensors, two switches, and two pixels.
Figure 4F:
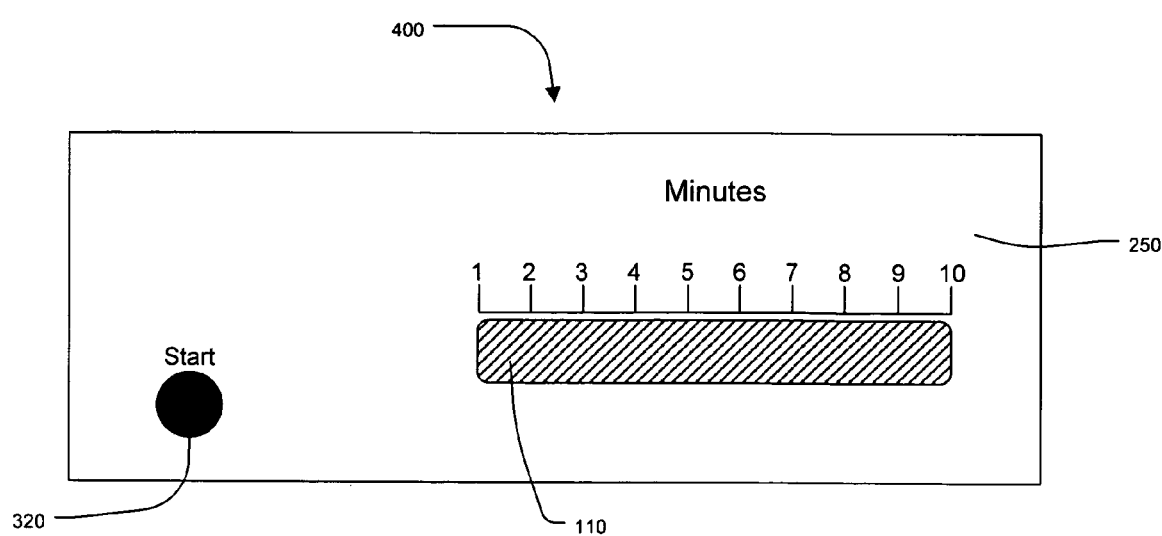
FIG. 4F is a top view of the label structure shown in FIG. 3B including timeline on the graphic ink layer to give context to the imaging display material.

In yet another embodiment, the timer construction shown in FIGS. 3B and 4F provides for a development of color in display material 110 at a fixed resistance and voltage. Cathodic electrode 130 is arranged askew relative to anodic electrode 120, such that the display material 110 will image sooner at points where the electrodes are closer and later at points where the electrodes are further apart. The display material 110 images along the electrodes substantially linearly with respect to time. As shown in FIG. 4F, by providing visual time or color references in graphics layer 250, the elapsed time is determined by comparing the progression of imaged display material 110 or the color visibly developed in the display material 110 against the visual reference. By changing the resistance of resistor 410 in anodic electrode 120, a change in the time scale is achieved, which allows timers with various ranges to be produced from the same basic design and materials.

Variable Instructions and Other Applications

In still another embodiment, the present invention makes possible a new way of presenting use instructions. For some medicines or nutriceuticals, the recommended dose or amount to be consumed is variable depending on age or weight or other patent dimensions. A conventional way to present this information is in the form of a table or verbal description printed on an instruction sheet. If the table is complex, this can be difficult to understand and may be too large to present on a small container, at least in print fonts of reasonable size.

Figure 6:
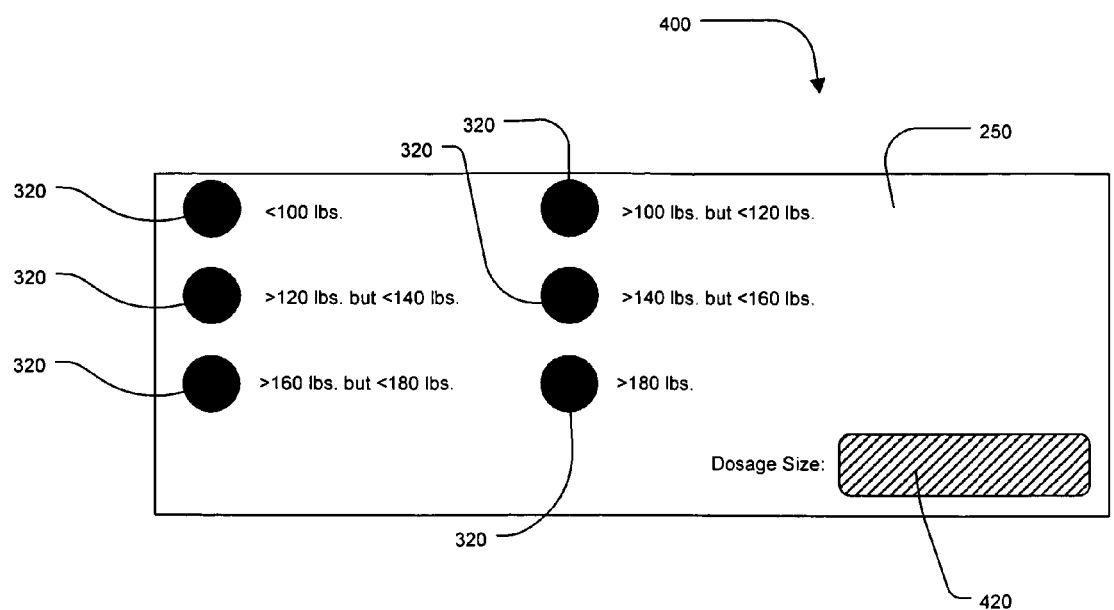
FIG. 6 is a top view of a label structure of the present invention including six switches and being configured to show a product dosage size.

In FIG. 6 is shown a label configuration in which the user can select a button switch 320 for one of several weight ranges. By closing the switch, the user completes a circuit for a particular configuration of a segmented display 420, which identifies the dose or amount to be consumed, e.g., "1.5 TSP" or "0.5 oz." Each switch may be electrically connected to complete a separate circuit corresponding to unique deposits of display material. Alternatively, each switch may be electrically configured to logic components arranged to display different information on the same display material depending on the selected switch.

In another embodiment of the present invention, a holographic product authentication label can be produced that provides the user with an active mark when activated through an external power source. In this example, a co-planar geometry is employed with a conductive ITO sputtered front plane and patterned backplane which form the image. In this particular example, an embossed polyester film is sputtered with ITO to achieve a holographic effect on the surface of the display. When the display is inactive, the label appears to have a traditional hologram on the surface, which is formed in graphics layer 250. When the display is activated, the hologram is altered with either a discreet image or the entire hologram can change color.

The display is activated by providing an external probe which provides at least 1.5V to the display. The use of the probe eliminates the need for an internal power source and allows the hologram to be "activated" using a special probe to increase the security of the device. A further dimension of security may be added by use of the timing structures discussed above, such that the hologram is altered only after a specified lapse of time.

In another embodiment of the present invention, the timer label described above is both powered and activated through the use of RF energy. In this example, a RF antenna is included in the conductive circuit. The antenna couples with a reader which provides the power for the timer circuit. Since the label is inactive until power is provided, moving the label within the reader range activates the timer thereby functioning as the switch as well. Radio frequency readers typically operate at 13.56 Mhz although other frequencies are employed as well. The energy inductively coupled is in the form of Alternating Current therefore a diode is included to convert the power to Direct Current to power the display. Therefore the timer is active whenever the antenna is coupled to the reader.

In another embodiment of the present invention, a holographic display suitable for product authentication is produced, which is both powered and activated through the use of RF energy. In this example, the label has the appearance of a traditional hologram until it passes through a reader field where the display activates, providing an active hologram.

The label construction may also be configured with variations of the aforementioned arrangements. For example, FIGS. 4D and 4E show label constructions that include two sensors 330/360, where the sensors are configured to complete the electrical connection between electrodes 120/130 and battery 310 responsive to a desired environmental condition being satisfied, such as temperature. Sensor 330 is configured to actuate a display pixel 420 if a predetermined low temperature is sensed and sensor 360 is configured to actuate a different display pixel 420 if a predetermined high temperature is sensed. The label construction shown in FIG. 4E further includes two switches 320/340 for providing a secondary actuator for each pixel 420.

Conclusion

The above examples illustrate the range and flexibility of the printed structure of the present invention. In particular, the present invention may be used to produce efficiently an active display in label and non-label constructions that provide specified electronic functionality of a variety uses. Those skilled in the art will recognize that other components and configurations can be practiced and are within the scope of the present invention.

What is claimed is:

1. A thin, layered structure with an active display, comprising:
   a base layer and a cover layer of material;
   a display component situated between the base layer and the cover layer, the display component including a layer of electrochromic ink and a pair of spaced apart electrodes in electrical connection with the layer of electrochromic ink; and
   an actuator configured to complete an electrical connection between a power source and the pair of spaced apart electrodes of the display component, wherein an image formed by the electrochromic ink is visible through a window in the cover layer less than one second after the electrical connection is completed.

2. The layered structure of claim 1, wherein the power source includes a battery situated between the base layer and the cover layer.

3. The layered structure of claim 2, wherein the actuator includes a switch for completing the electrical connection between the power source and the pair of spaced apart electrodes.

4. The layered structure of claim 1, wherein the actuator includes an environmental sensor for selectively completing the electrical connection between the power source and the pair of spaced apart electrodes upon the occurrence of a sensed condition.

5. The layered structure of claim 1, wherein the power source includes a pair of terminals, the pair of terminals being exposed external to the cover layer.

6. The layered structure of claim 1, wherein the actuator includes a pair of terminals adopted to receive an external probe of the power source thereby completing the electrical connection between the power source and the pair of spaced apart electrodes.

7. The layered structure of claim 1, wherein the power source includes an RF antenna situated between the base layer and the cover layer.

8. The layered structure of claim 7, wherein the actuator includes a RF transmitter configured to transmit RF waves receivable by the RF antenna thereby providing an electrical current to the spaced apart electrodes.

9. The layered structure of claim 1, further comprising a graphics layer situated over the cover layer, the graphics layer having a static image.

10. The layered structure of claim 9, wherein the graphics layer includes a window configured to allow the display component to be visible therethrough.

11. The layered structure of claim 9, wherein the graphics layer includes a holographic film configured to allow the display component to be visible therethrough.

12. The layered structure of claim 10, wherein the static image includes a visual reference arranged such that the visual reference provides context to the display component.

13. The layered structure of claim 12, wherein the visual reference includes a first shade of a color associated with a first elapsed time value and a second shade of the color associated with a second elapsed time value.

14. The layered structure of claim 12, wherein the visional reference includes a time scale associated with an elapsed time value corresponding to a known time at which a volume of the layer of electrochromic ink images.

15. The layered structure of claim 1, wherein the base layer includes an adhesive coating sufficient to adhere the layered structure to another object.

16. A thin, layered timer structure with an active display for communicating elapsed time, comprising:
   a base layer and a cover layer of material;
   a display component situated between the base layer and the cover layer, the display component including a layer of electrochromic ink forming a first pixel and a second pixel;
   a first electrode and a second electrode, the first electrode and the second electrode being spaced apart and being in electrical connection with the layer of electrochromic ink, the first electrode being in electrical connection with the first pixel with a first resistance therebetween and the first electrode further being in electrical connection with the second pixel with a second resistance therebetween;
   a power source and a pair of electrical traces for electrically connecting the power source to the first and second electrodes; and
   an actuator configured to complete an electrical connection between the power source and the first and second electrodes of the display component, wherein the first pixel is visible through a window in the cover layer at a time after the connection is completed, wherein the time is directly dependent on the value of the first resistance.

17. The layered structure of claim 16, further comprising a graphics layer situated over the cover layer, the graphics layer having a time scale and a window configured to allow the first and second pixels to be visible therethrough.

18. The layered structure of claim 17, wherein the time scale provides distinct temporal contexts to the first and second pixels.

19. The layered structure of claim 18, wherein the time scale includes a first elapsed time value proximate the first pixel and a second elapsed time value proximate the second pixel.

20. The layered structure of claim 16, wherein the power source includes a battery situated between the base layer and the cover layer.

21. The layered structure of claim 20, wherein the actuator includes a switch for completing the electrical connection between the power source and the first and second electrodes.

22. The layered structure of claim 16, wherein the actuator includes a sensor for completing the electrical connection between the power source and the first and second electrodes.

23. A thin, layered structure with an active display comprising:
   a base layer and a cover layer;
   a display component situated between the base layer and the cover layer, the display component including a layer of electrochromic ink and a pair of spaced apart electrodes in electrical connection with the layer of electrochromic ink;
   a power source and a pair of electrical traces for electrically connecting the power source to the pair of spaced apart electrodes; and
   a user selectable input with at least two states, the display providing a first display with the input in a first state and a second display with the input in a second state, wherein an image formed by the layer of electrochromic ink is visible through a window in the cover layer less than one second after the user selectable input is completed.

24. A thin, layered structure with an active display, comprising:
   a base layer and a cover layer of material;
   a display component situated between the base layer and the cover layer, the display component including a layer of electrochromic ink and a pair of spaced apart electrodes in electrical connection with the layer of electrochromic ink;
   a power source and a pair of electrical traces for electrically connecting the power source to the pair of spaced apart electrodes; and
   an actuator configured to complete an electrical connection between the power source and the pair of spaced apart electrodes of the display component, wherein an image formed by the electrochromic ink is visible through a window in the cover layer less than one second after the electrical connection is completed.

25. The layered structure of claim 24, wherein the power source includes a battery situated between the base layer and the cover layer.

26. The layered structure of claim 25, wherein the actuator includes a switch for completing the electrical connection between the power source and the pair of spaced apart electrodes.

27. The layered structure of claim 24, wherein the actuator includes an environmental sensor for selectively completing the electrical connection between the power source and the pair of spaced apart electrodes upon the occurrence of a sensed condition.

28. The layered structure of claim 24, wherein the power source includes a pair of terminals, the pair of terminals being exposed external to the cover layer.

29. The layered structure of claim 28, wherein the actuator includes an external probe configured to contact the pair of terminals thereby completing the electrical connection between the power source and the pair of spaced apart electrodes.

30. The layered structure of claim 24, wherein the power source includes an RF antenna situated between the base layer and the cover layer.

31. The layered structure of claim 30, wherein the actuator includes a RF transmitter configured to transmit RF waves receivable by the RF antenna thereby providing an electrical current to the spaced apart electrodes.

32. The layered structure of claim 24, further comprising a graphics layer situated over the cover layer, the graphics layer having a static image.

33. The layered structure of claim 32, wherein the graphics layer includes a window configured to allow the display component to be visible therethrough.

34. The layered structure of claim 32, wherein the graphics layer includes a holographic film configured to allow the display component to be visible therethrough.

35. The layered structure of claim 27, wherein the static image includes a visual reference arranged such that the visual reference provides context to the display component.

36. The layered structure of claim 35, wherein the visual reference includes a first shade of a color associated with a first elapsed time value and a second shade of the color associated with a second elapsed time value.

37. The layered structure of claim 24, wherein the base layer includes an adhesive coating sufficient to adhere the layered structure to another object.

* * * * *